(12) United States Patent
Ueda (10) Patent No.: US 6,293,713 B1
(45) Date of Patent: Sep. 25, 2001

(54) SUBSTRATE PROCESSING APPARATUS (75) Inventor: Issei Ueda, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/606,194

(22) Filed: Jun. 29, 2000

(30) Foreign Application Priority Data

Jul. 2, 1999 (JP) .................................................. 11-188664

(51) Int. Cl.⁷ ...................................................... G03D 5/00
(52) U.S. Cl. ............................. 396/611; 118/52; 29/25.01
(58) Field of Search .................................. 396/604, 611; 414/935, 136, 416, 225; 134/1, 2, 157, 4, 902; 118/52, 316, 319, 320, 500, 716, 726; 29/25.01

(56) References Cited

U.S. PATENT DOCUMENTS

| | | | |
|---|---|---|---|
| 5,664,254 | 9/1997 | Ohkura et al. ........................ | 396/611 |
| 5,942,013 | 8/1999 | Akimoto ............................. | 29/25.01 |
| 5,972,110 | * 10/1999 | Akimoto ................................ | 118/52 |
| 6,126,703 | * 10/2000 | Akimoto et al. ..................... | 29/25.01 |

* cited by examiner

*Primary Examiner*—D. Rutledge
(74) *Attorney, Agent, or Firm*—Oblon, Spivak, McClelland, Maier & Neustadt, P.C.

(57) ABSTRACT

A substrate processing apparatus comprising a substrate carrying section which carries in and out the substrate, a processing section including a plurality of processing units which are vertically stacked and subject the substrate to various kinds of processing, a main transfer machine which freely moves in a vertical direction in the processing section, for transferring the substrate from one of the processing units to another of the processing units, and a secondary transfer machine which freely moves in a vertical direction in the substrate carrying section, for delivering the substrate between the substrate carrying section and the processing section and transferring the substrate from one processing unit to another processing unit in the processing section when not delivering the substrate.

20 Claims, 10 Drawing Sheets

SUBSTRATE PROCESSING APPARATUS

CROSS-REFERENCE TO RELATED APPLICATIONS

This application is based upon and claims the benefit of priority from the prior Japanese Patent Application No. 11-188664, filed Jul. 2, 1999, the entire contents of which are incorporated herein by reference.

BACKGROUND OF THE INVENTION

The present invention relates to a substrate processing apparatus for performing various kinds of processing for a substrate such as a semiconductor wafer or the like, for example, a substrate processing apparatus for coating the substrate with a resist and developing the exposed substrate.

In the process of fabricating a semiconductor device, there is a series of processing steps of coating a semiconductor wafer which is a substrate to be processed with a photoresist solution, reducing a circuit pattern or the like and exposing a photoresist film by means of photolithography, and performing developing processing. These processing steps are extremely important to high integration of the semiconductor device.

In these processing steps, the semiconductor wafer which has undergone cleaning processing is first subjected to hydrophobic processing in an adhesion processing unit and cooled in a cooling processing unit, and thereafter a photoresist film is formed by coating in a resist coating unit. The semiconductor wafer on which the photoresist film is formed is subjected to pre-bake processing in a hot plate unit, cooled in a cooling processing unit, and then exposed in accordance with a predetermined pattern in an aligner. Subsequently, the exposed semiconductor wafer is subjected to post-exposure bake processing and cooled in a cooling processing unit, and a developing solution is applied and the exposed pattern is developed in a developing unit. Finally, the semiconductor wafer is subjected to post-bake processing in the hot plate unit.

Out of such a series of processing steps, the steps except for exposure processing are performed by a resist coating and developing processing system into which the processing units are integrated. As one proposal for the structure of such a resist coating and developing processing system, there is proposed the structure in which a plurality of processing units for performing the processing are vertically stacked around a transfer path extending in a vertical direction, and the semiconductor wafer is carried into/out of each of the processing units by a main transfer machine which moves vertically in the transfer path and includes an arm moving in a horizontal direction. When a substrate is transferred between a plurality of processing units, such a processing system makes it possible to shorten the transfer route of the substrate and to downsize the system, and consequently the transfer of the substrate can be performed in a short time, thereby raising efficiency of the system.

In the processing system, however, the transfer of the substrate between the processing units is performed by the main transfer machine, and hence the entire processing speed is determined by the capacity of the main transfer machine. However, there is a limit to improvement in the capacity of the main transfer machine, and there is a possibility that the processing system can not sufficiently meet the recent increasing demands for improvement in throughput.

Compliance with these demands by an increase in the number of the main transfer machines is considered, but the system becomes complicated, thereby causing a rise in fabrication costs and complication of control.

BRIEF SUMMARY OF THE INVENTION

It is an object of the present invention to provide a substrate processing apparatus capable of improving substrate processing capacity without causing complication of the apparatus.

According to a first aspect of the present invention, there is provides a substrate processing apparatus comprising a substrate carrying section configured to carry in and out the substrate, a processing section including a plurality of processing units vertically stacked and configured to subject the substrate to various kinds of processing, a main transfer machine configured to freely move in a vertical direction in the processing section, for transferring the substrate from one of the processing units to another of the processing units, and a secondary transfer machine configured to freely move in a vertical direction in the substrate carrying section, for delivering the substrate between the substrate carrying section and the processing section and transferring the substrate from one processing unit to another processing unit in the processing section when not delivering the substrate.

According to the above structure, instead of transferring the substrate between a plurality of processing units by only the main transfer machine in the processing section, when the secondary transfer machine which ordinarily carries the substrate in and out in the substrate carrying section does not perform ordinary operation, the secondary transfer machine vertically moves to thereby be able to transfer the substrate between the plurality of processing units in the processing section. As a result, the secondary transfer machine can assist the main wafer transfer machine in a part of the transfer process of the main transfer machine, leading to not only improvement in transfer capacity as a whole, but also improvement in substrate processing speed.

The processing section can be structured to have at least two processing unit groups in each of which a plurality of processing units are vertically stacked, and the main transfer machine can be structured to be disposed to be surrounded by the at least two processing unit groups.

In this case, the secondary transfer machine can be structured to be allowed to receive the substrate from one processing unit of one processing unit group, move vertically, and deliver the substrate to another processing unit of the same processing unit group, and also can be structured to be allowed to receive the substrate from any one processing unit of one processing unit group, move horizontally or vertically, and deliver the substrate to any one processing unit of another processing unit group.

According to a second aspect of the present invention, there is provided a substrate processing apparatus for coating a substrate with a resist and subjecting the substrate to developing processing after the resist is exposed in accordance with a predetermined pattern, the apparatus comprising a substrate carrying section configured to carry in and out the substrate, a processing section having a plurality of processing units vertically stacked and configured to subject the substrate to resist coating and developing processing and thermal processing before and after the resist coating and developing processing, a main transfer machine disposed to freely move in a vertical direction in the processing section, for transferring the substrate from one of the processing units to another of the processing units, and a secondary transfer machine disposed to freely move in a vertical direction in the substrate carrying in/out section, for delivering the substrate between the substrate carrying section and the processing section and transferring the substrate from one of the processing units to another of the processing units in the processing section when not delivering the substrate.

According to the second aspect of the invention, in the processing section in which a plurality of processing units are vertically stacked, the processing units subjecting the substrate to resist coating and developing processing and thermal processing before and after the resist coating and developing processing, similarly to the first aspect, the secondary transfer machine can assist the main transfer machine in a part of the transfer process of the main transfer machine. As a result, in resist coating and developing processing requiring many processing units and many processing steps, transfer capacity can be improved as a whole, resulting in improvement in a substrate processing speed.

In this case, the apparatus can be structured to further comprise an interface section in which the substrate is delivered between the processing section and an aligner, and another secondary transfer machine, disposed to freely move in a vertical direction in the interface section, for delivering the substrate between the interface section and the processing section and transferring the substrate from one processing unit to another processing unit in the processing section when not performing the substrate delivery operation. Thus, another secondary transfer machine also can assist the main transfer machine in a part of the transfer process of the main transfer machine. Consequently, transfer capacity can be further improved.

According to a third aspect of the present invention, there is provided a substrate processing apparatus for coating a substrate with a resist and subjecting the substrate to developing processing after the resist is exposed in accordance with a predetermined pattern, the apparatus comprising a substrate carrying section configured to carry in and out the substrate, a processing section including a plurality of processing units vertically stacked and configured to subject the substrate to resist coating and developing processing and thermal processing before and after the resist coating and developing processing, a main transfer machine configured to freely move in a vertical direction in the processing section, for transferring the substrate from one of the processing units to another of the processing units, an interface section configured to deliver the substrate between the processing section and an aligner, and a secondary transfer machine configured to freely move in a vertical direction in the interface section, for delivering the substrate between the interface section and the processing section and transferring the substrate from one of the processing units to another of the processing units in the processing section when not delivering the substrate.

Also, by providing the secondary transfer machine disposed to freely move in a vertical direction in the interface section, for delivering the substrate between the interface section and the processing section and transferring the substrate from one processing unit to another processing unit in the processing section when not performing the delivery of the substrate as described above, the main wafer transfer machine can be assisted in a part of the transfer process of the main transfer machine, thereby further improving transfer capacity.

In the aspects of the invention, the processing section can be structured to have at least two processing unit groups in each of which a plurality of processing units are vertically stacked, and the main transfer machine can be structured to be disposed to be surrounded by the at least two processing unit groups.

In this case, one processing unit group can be structured to have a plurality of thermal system processing units each for performing thermal processing for the substrate, and another processing unit group can be structured to have a plurality of rotary system processing units each for performing processing of coating the substrate with the resist or a developing solution while rotating the substrate.

Further, the secondary transfer machine or the another secondary transfer machine can be structured to be allowed to receive the substrate from one thermal system processing unit of the one processing unit group and deliver another thermal system processing unit of the same processing unit group. Furthermore, the secondary transfer machine or the another secondary transfer machine can be structured to be allowed to transfer the substrate between the one processing unit group having the thermal system processing units and the another processing unit group having the rotary system processing units.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will be described in detail below with reference to the accompanying drawings.

Figure 1:
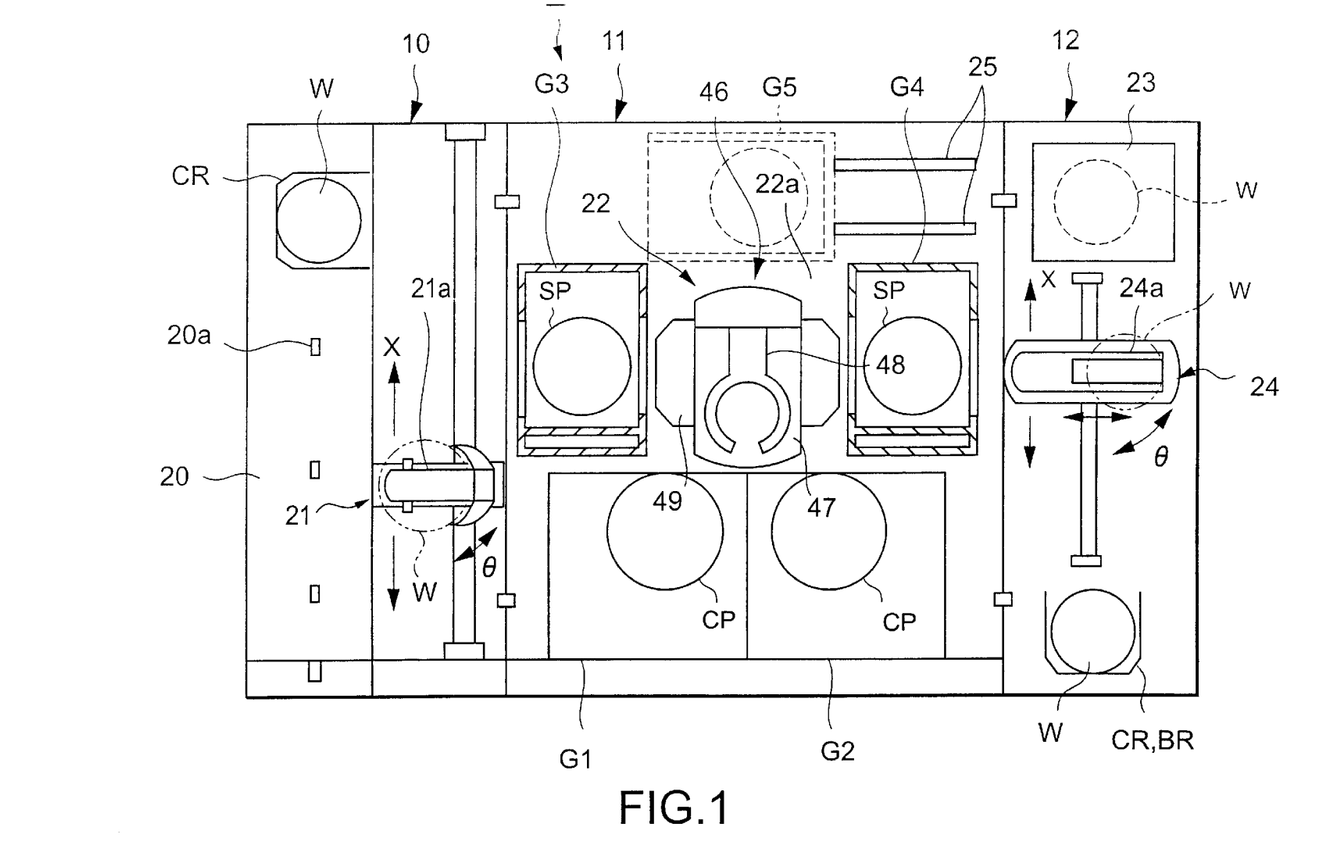
FIG. 1 is a plane view showing the entire structure of a resist coating and developing processing system for a semiconductor wafer according to an embodiment of the present invention.
Figure 2:
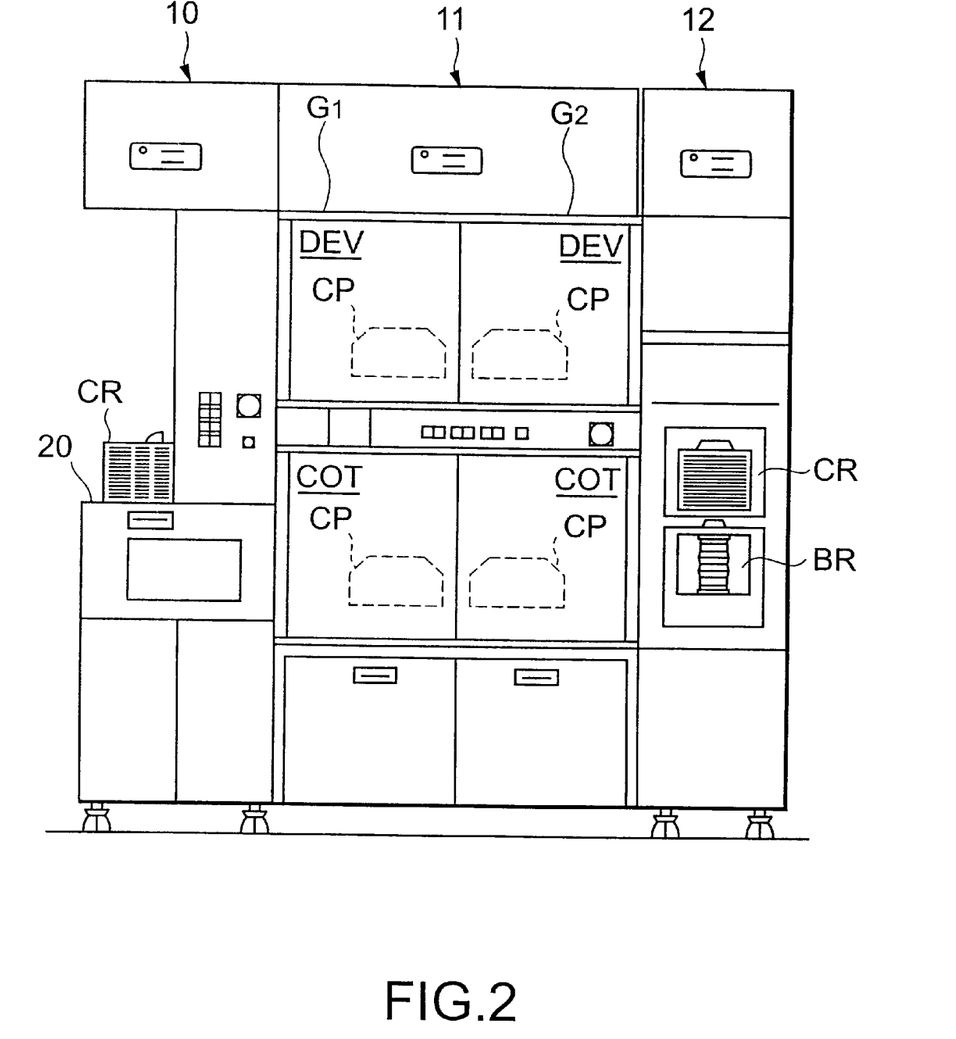
FIG. 2 is a front view showing the entire structure of the resist coating and developing processing system for the semiconductor wafer according to the embodiment of the present invention.
Figure 3:
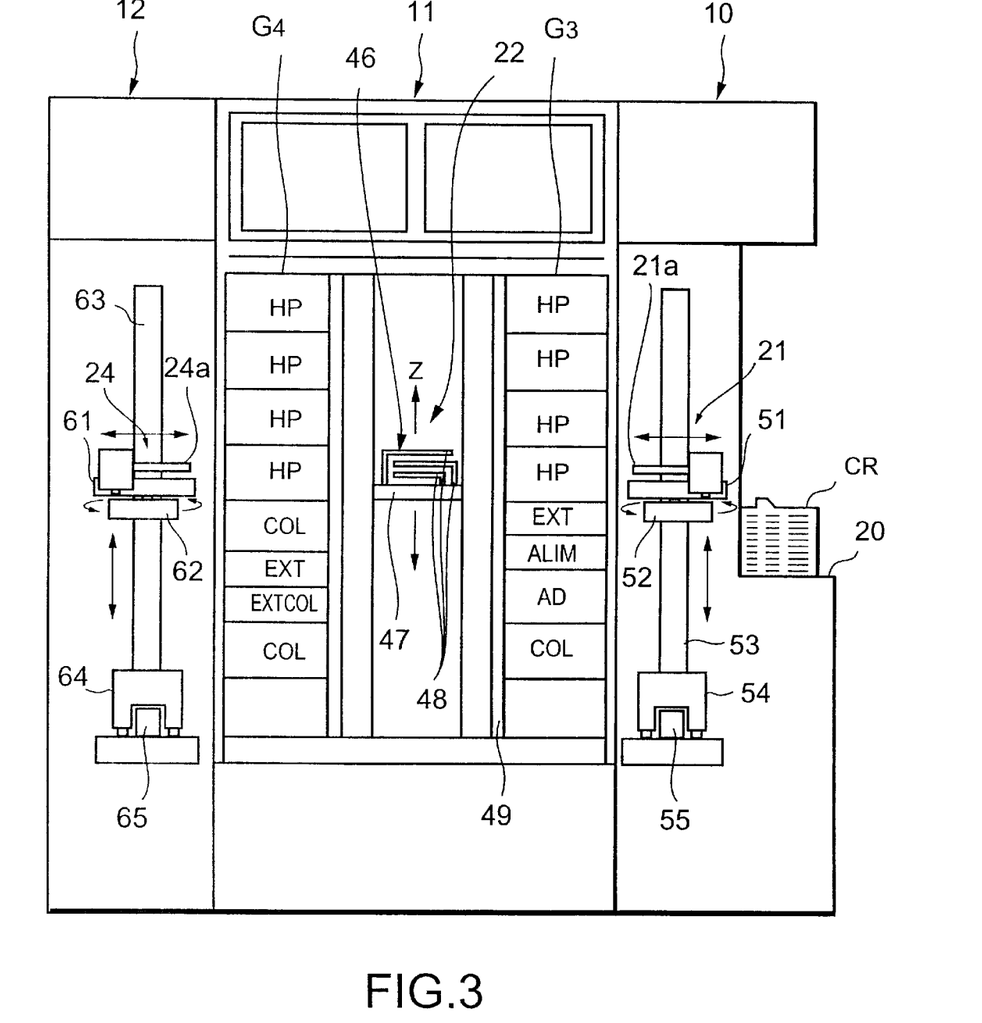
FIG. 3 is a rear view showing the entire structure of the resist coating and developing processing system for the semiconductor wafer according to the embodiment of the present invention.

FIG. 1 is a schematic plane view showing a resist coating and developing processing system according to an embodiment of a substrate processing apparatus of the present invention, FIG. 2 is a front view thereof, and FIG. 3 is a rear view thereof.

The resist coating and developing processing system 1 includes a cassette station 10 as a transfer station, a processing station 11 having a plurality of processing units, and an interface section 12 for delivering a wafer W from/to an aligner (not illustrated) provided adjacent to the processing station 11.

The cassette station 10 is to carry a plurality of, for example, 25 semiconductor wafers W (hereinafter referred to as only wafers) as objects to be processed, as a unit, housed in a wafer cassette CR from another system into this system or from this system into another system, and transferring the wafer W between the wafer cassette CR and the processing station 11.

In this cassette station 10, as shown in FIG. 1, a plurality of (four in FIG. 1) positioning projections 20a are formed on a cassette mounting table 20 along an X-direction in FIG. 1. The wafer cassettes CR can be mounted in a line with respective wafer transfer ports facing the processing station 11 side at the positions of the projections 20a. In the wafer cassette CR, the wafers W are arranged in a vertical direction (a Z-direction). Moreover, the cassette station 10 includes a secondary wafer transfer machine 21 disposed between the wafer cassette mounting table 20 and the processing station 11.

The processing station 11 includes a plurality of processing units for carrying out a series of processes when coating and developing are performed for the wafer W. These units are stacked at predetermined positions, and the wafers W are processed one by one by these units. As shown in FIG. 1, the processing station 11 has a transfer path 22a in the middle thereof, a main wafer transfer mechanism 22 is provided in the transfer path 22a, and all the processing units are arranged around the wafer transfer path 22a. The plurality of processing units are divided into a plurality of processing unit groups, and a plurality of processing units are stacked at multi-stages along the vertical direction in each processing unit group.

As shown in FIG. 1, in this embodiment, four processing unit groups $G_1$, $G_2$, $G_3$, and $G_4$ are actually arranged around the wafer transfer path 22a, and a processing unit group $G_5$ can be disposed as required.

Out of these unit groups, the first and second processing unit groups $G_1$ and $G_2$ are arranged in a row on the front side of the system (on the lower side in FIG. 1), the third processing unit group $G_3$ is arranged adjacent to the cassette station 10, and the fourth processing unit group $G_4$ is arranged adjacent to the interface section 12. Moreover, the fifth processing unit group $G_5$ can be arranged on the rear side.

In the above case, as shown in FIG. 2, in the first processing unit group $G_1$, two spinner-type processing units are vertically stacked at two stages, each of the processing units subjecting the wafer W to predetermined processing while the wafer W is mounted on a spin chuck (not illustrated) inside a cup CP. In this embodiment, a resist coating unit (COT) for coating the wafer W with a resist and a developing unit (DEV) for developing a pattern of the resist are stacked at two stages from the bottom in order. Similarly, in the second processing unit group $G_2$, a resist coating unit (COT) and a developing unit (DEV) as two spinner-type processing units are stacked at two stages from the bottom in order.

The reason why the resist coating unit (COT) and the like are disposed on the lower stage side is that drainage of a resist solution is essentially more complex in terms of both mechanism and maintenance than that of a developing solution, and that the complexity is mitigated by disposing the resist coating unit (COT) and the like at the lower tier as described above. It is possible, however, to arrange the resist coating unit (COT) and the like at the upper stage as required.

As shown in FIG. 3, in the third processing unit group $G_3$, oven-type processing units are stacked at multi-stages and each subject the wafer W to predetermined processing while the wafer W is placed on a mounting table SP. Namely, a cooling unit (COL) for performing cooling processing, an adhesion unit (AD) for performing so-called hydrophobic processing to enhance adhesion of the resist, an alignment unit (ALIM) for performing alignment, an extension unit (EXT) for carrying the wafer W in and out, and four hot plate units (HP) for subjecting the wafer W to heat processing before and after exposure processing and after developing processing are stacked at eight stages from the bottom in order. It is suitable to provide a cooling unit (COL) in place of the alignment unit (ALIM) and to give the cooling unit (COL) an alignment function.

Also in the fourth processing unit group $G_4$, oven-type processing units are stacked at multi-stages. Specifically, a cooling unit (COL), an extension and cooling unit (EXTCOL) which is a wafer carrying section provided with a chill plate, an extension unit (EXT), a cooling unit (COL), and four hot plate units (HP) are stacked at eight stages from the bottom in order.

The above arrangement of the cooling unit (COL) and the extension and cooling unit (EXTCOL) having low processing temperature at the lower stage and the hot plate units (HP) having high processing temperature at the upper stage can reduce thermal mutual interference between units. Random multi-stage arrangement is naturally suitable.

As described above, the fifth processing unit group $G_5$ can be provided on the rear side of the main wafer transfer mechanism 22. In the case where the fifth processing unit group $G_5$ is provided, it can be moved along guide rails 25 laterally when seen from the main wafer transfer mechanism 22. Accordingly, even when the fifth processing unit group $G_5$ is provided, a space portion is secured by sliding the fifth processing unit group $G_5$ along the guide rails 25, so that maintenance operations for the main wafer transfer mechanism 22 can be easily performed from the back thereof. In this case, a space can be secured not only by moving the fifth processing unit group $G_5$ linearly, but also by turning it. Incidentally, one processing unit group basically having a structure in which oven-type processing units are arranged at multi-stages likewise with the third and fourth processing unit groups $G_3$ and $G_4$ can be used as the fifth processing unit group $G_5$.

The interface section 12 has the same length as the processing station 11 in a depth direction (the X-direction). As shown in FIG. 1 and FIG. 2, a transportable pickup cassette CR and a fixed-type buffer cassette BR are arranged at two stages at the front of the interface section 12, a peripheral aligner 23 is disposed at the rear, and a secondary wafer transfer machine 24 is disposed at the center.

Next, a wafer transfer mechanism in this embodiment will be explained.

As shown in FIG. 3, the main wafer transfer mechanism 22 in the processing station 11 includes a main wafer transfer machine 46 which is ascendable and descendable in the vertical direction (the Z-direction) within a cylindrical supporter 49. The cylindrical supporter 49 can rotate by rotational driving force of a motor (not illustrated), and the main wafer transfer machine 46 can also rotate integrally with the cylindrical supporter 49.

The main wafer transfer machine 46 includes a plurality of (three in FIG. 3) holding members 48 which are movable in a forward and a rearward direction of a transfer base 47. The delivery of the wafer W between the processing units is performed by these holding members 48.

The secondary wafer transfer machine 21 in the cassette station 10 includes a wafer holding member 21a movable in the direction of arrangement of the cassettes (the X-direction), in the vertical direction (the Z-direction), and in the forward and the rearward direction, and also rotatable in a θ-direction, and the wafer holding member 21a can selectively get access to any of the wafer cassettes CR. Moreover, the wafer holding member 21a can get access to each of the units included in the third processing unit group $G_3$ in the processing station 11 by rotating in the θ-direction and moving in the Z-direction from the above state. Therefore, the secondary wafer transfer machine 21 can assist the main wafer transfer machine 46 as will be described later in addition to deliver the wafer W from/to the wafer cassette CR and to transfer the wafer W into the processing station 11. More specifically, as shown in FIG. 3, in the secondary wafer transfer machine 21, the wafer holding member 21a is supported to be movable back and forth by a base member 51. The base member 51 is supported to be rotatable by an ascent/descent member 52. The ascent/descent member 52 is raised and lowered while being guided by a guide member 53. The guide member 53 extends upward from a travel section 54, and the travel section 54 travels on a rail 55 provided along the direction of arrangement of the cassettes CR. It should be noted that the wafer holding member 21a of the secondary wafer transfer machine 21 can be structured to be accessible also to each of the processing units included in the first processing unit group $G_1$.

The secondary wafer transfer machine 24 in the interface section 12 has a wafer holding member 24a movable in the X-direction and the Z-direction and rotatable in the θ-direction, and the wafer holding member 24a is accessible to both the cassettes CR and BR, the peripheral aligner 23, and a wafer delivery table (not illustrated) on the aligner side. Moreover, the wafer holding member 24a can get access to each of the units included in the fourth processing unit group $G_4$ of the processing station 11 by rotating in the θ-direction and moving in the Z-direction. Therefore, the secondary wafer transfer machine 24 can assist the main wafer transfer machine 46 as will be described later in addition to transfer the wafer W between the processing station and the aligner. More specifically, as shown in FIG. 3, in the secondary transfer machine 24, the wafer holding member 24a is supported to be movable back and forth by a base member 61. The base member 61 is supported to be rotatable by an ascent/descent member 62. The ascent/descent member 62 is raised and lowered while being guided by a guide member 63. The guide member 63 extends upward from a travel section 64, and the travel section 64 travels on a rail 65 provided along the X-direction. It should be noted that the wafer holding member 24a of the secondary wafer transfer machine 24 can be structured to be accessible also to each of the processing units included in the second processing unit group $G_2$.

In the resist coating and developing processing system 1 structured as above, in the cassette station 10, the wafer holding member 21a of the secondary wafer transfer mechanism 21 first gets access to the wafer cassette CR housing unprocessed wafers W on the cassette mounting table 20 and takes one wafer W out of the cassette CR and transfers the wafer W to the extension unit (EXT) of the third processing unit group $G_3$.

The wafer W is carried into the processing station 11 from the extension unit (EXT) by means of the main wafer transfer machine 46 of the main wafer transfer mechanism 22. Then, the wafer W is aligned in the alignment unit (ALIM) of the third processing unit group $G_3$ and thereafter transferred to the adhesion unit (AD), where hydrophobic processing (HMDS processing) for enhancing adhesion of the resist is performed for the wafer W. Since this processing involves heating, the wafer W is then transferred to the cooling unit (COL) by the main wafer transfer machine 46 and cooled.

The wafer W that been cooled in the cooling unit (COL) after the completion of the adhesion processing is subsequently transferred to the resist coating unit (COT), where a coating film is formed. After the completion of the coating processing, the wafer W is subjected to pre-bake processing in any one of the hot plate units (HP) of the processing unit groups $G_3$ and $G_4$ and cooled in any one of the cooling units (COL).

The cooled wafer W is transferred to the alignment unit (ALIM) of the third processing unit group $G_3$ and aligned there, and thereafter the wafer W is transferred to the interface section 12 via the extension unit (EXT) of the fourth processing unit group $G_4$.

In the interface section 12, the wafer W is first transferred to the peripheral aligner 23 by the wafer holding member 24a of the secondary wafer transfer machine 24, and peripheral exposure is performed for the wafer W to remove the excess resist there. Subsequently, the wafer W is transferred to the aligner provided adjacent to the interface section 12, and the resist film of the wafer W undergoes exposure processing in accordance with a predetermined pattern there.

The exposed wafer W is returned again to the interface section 12 and then transferred to the extension unit (EXT) included in the fourth processing unit group $G_4$ by the wafer holding member 24a of the secondary wafer transfer machine 24. The wafer W is transferred to any one of the hot plate units (HP) by the main wafer transfer machine 46 to undergo post-exposure bake processing and then cooled in the cooling unit (COL).

The wafer W is then transferred to the developing unit (DEV), where the exposed pattern is developed. After the completion of the developing, the wafer W is transferred to any one of the hot plate units (HP) to undergo post-bake processing and then cooled in the cooling unit (COL). After the completion of such a series of processing, the wafer W is transferred to the extension unit (EXT) of the third processing unit group $G_3$ and housed in any of the wafer cassettes CR in the cassette station 10 by the wafer holding member 21a of the secondary wafer transfer machine 21.

In the wafer transfer operation, hitherto the transfer of the wafer W in the processing station 11 has been performed by the main wafer transfer machine 46, but in this embodiment, the auxiliary transfer by means of the secondary wafer transfer machine 21 or the secondary wafer transfer machine 24 in addition to ordinary transfer by means of the main wafer transfer machine 46 can be performed.

Figure 4:
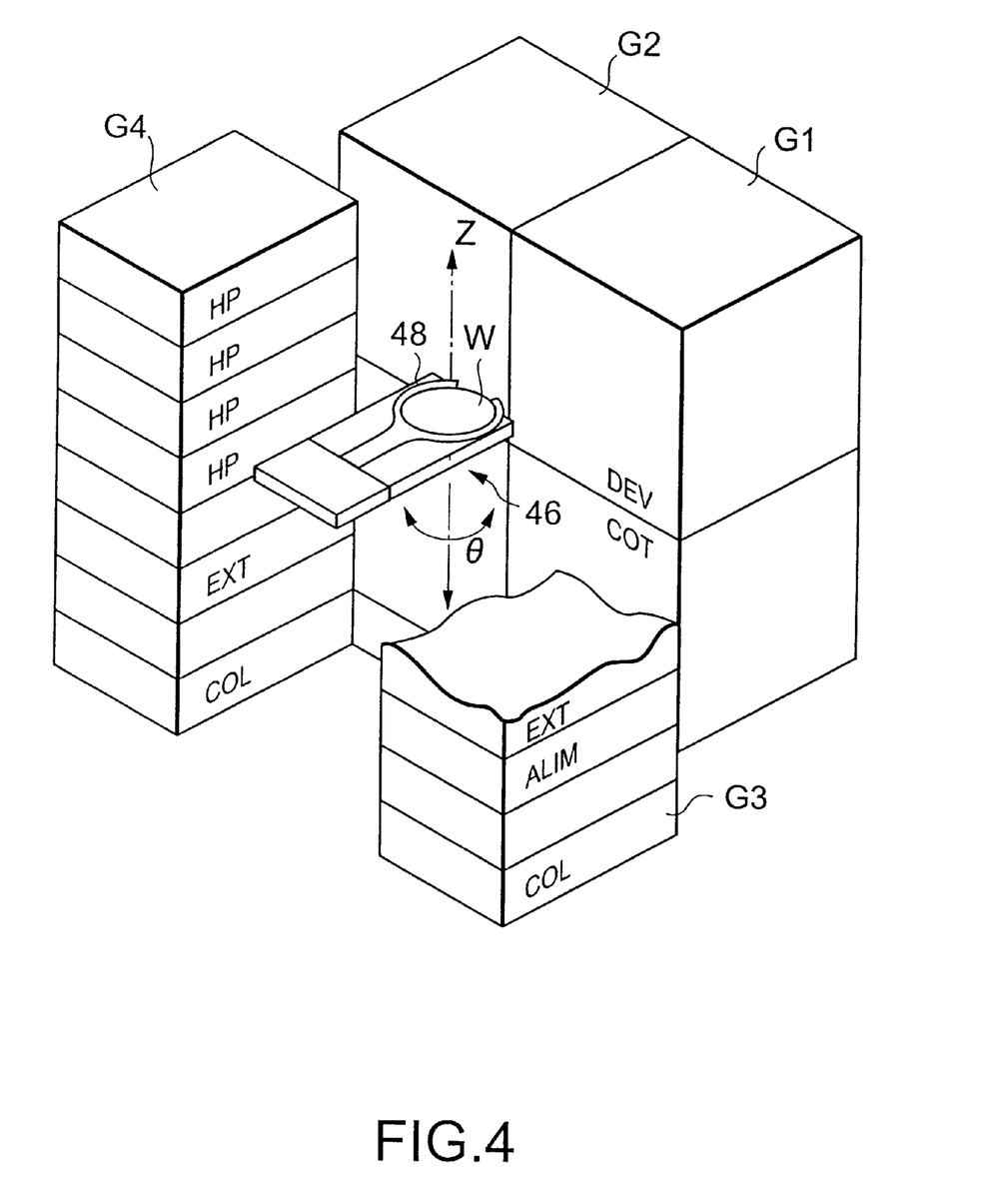
FIG. 4 is a schematic perspective view for explaining the transfer operation of a main wafer transfer machine provided in a processing station.

As shown in FIG. 4, in ordinary transfer, the main wafer transfer machine 46 in the processing station 11 holds the wafer W using the holding member 48 movable in a horizontal direction, and the main transfer machine 46 itself is ascendable and descendable in the vertical direction (the Z-direction) and rotatable in the θ-direction. Thus, the main wafer transfer machine 46 receives and sends the wafer W from/to each of the processing units using the holding member 48.

For instance, when transferring the wafer W between different processing units in the same processing unit group (for example, the third processing unit group $G_3$), for example, from the hot plate unit (HP) to the cooling unit (COL), the main wafer transfer machine 46 moves along the vertical direction (the Z-direction) without turning around to transfer the wafer W.

When transferring the wafer W between processing units of different processing unit groups, for example, from the resist coating unit ( COT) of the second processing unit group $G_2$ to the hot plate unit (HP) of the third processing unit group $G_3$, the main wafer transfer machine 46 rotates in the θ-direction while moving along the vertical direction (the Z-direction) to transfer the wafer W.

Meanwhile, in the case of ordinary transfer, the secondary wafer transfer machine 21 in the cassette station 10 takes the wafer W out of the cassette CR using the wafer holding member 21a, moves the wafer holding member 21a in the horizontal direction (the X-direction), and moves it in the vertical direction (Z-direction) within a predetermined range of altitude. Then, the transfer machine 21 rotates the wafer W in the θ-direction, and delivers it to the extension unit (EXT) or the alignment unit (ALIM) of the third processing unit group $G_3$ in the processing station 11. Moreover, the secondary wafer transfer machine 21 receives the wafer W which has undergone a series of processing by means of the wafer holding member 21a at the extension unit (EXT) of the third processing unit group $G_3$, and moves the wafer holding member 21a in the horizontal direction (the X-direction). Thereafter, the transfer machine 21 raises and lowers the wafer holding member 21a in the vertical direction (the Z-direction) within a predetermined range of altitude, rotates it in the θ-direction, and houses the wafer W in a predetermined cassette CR.

Figure 5:
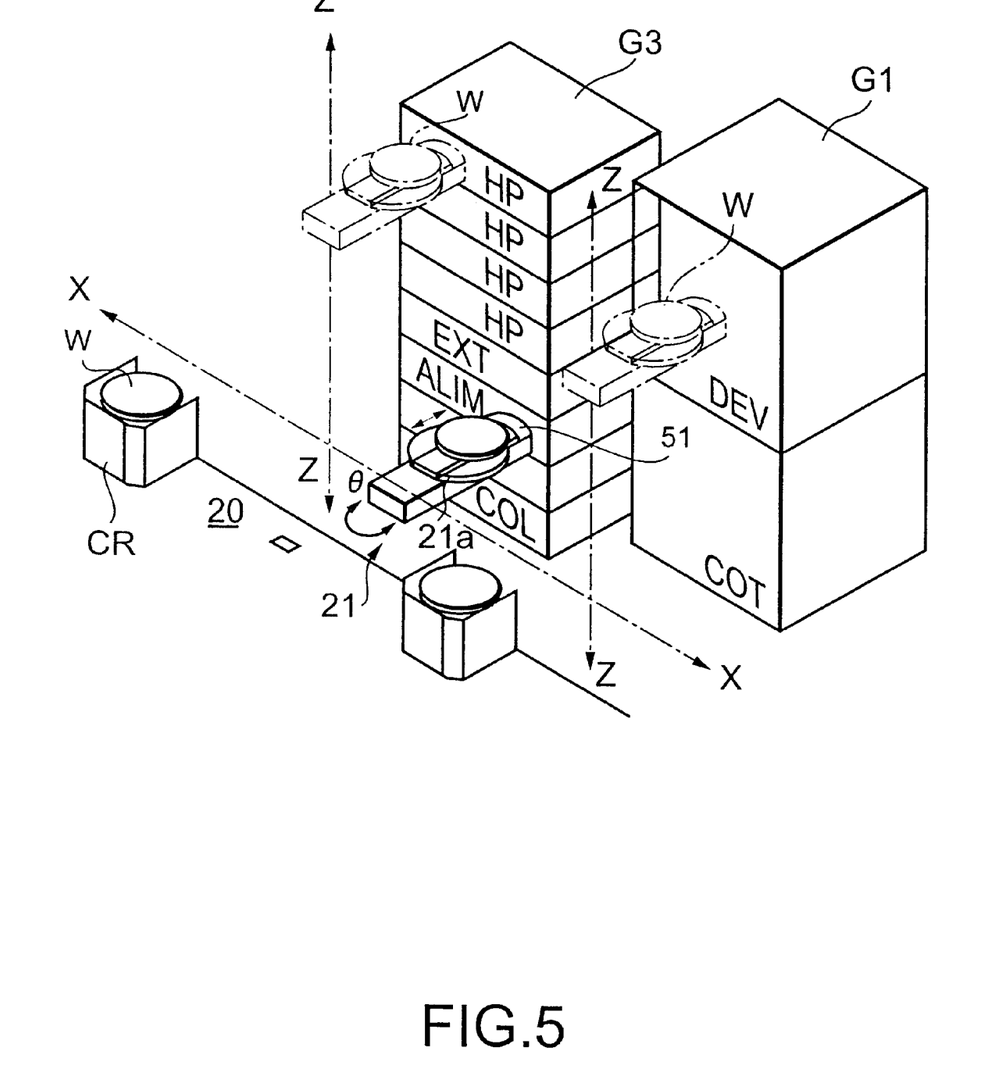
FIG. 5 is a schematic perspective view for explaining the transfer operation of a secondary wafer transfer machine provided in a cassette station.

The secondary wafer transfer machine 21 can perform auxiliary transfer when not performing the ordinary transfer. In the case of auxiliary transfer, as shown in FIG. 5, the wafer holding member 21a of the secondary transfer machine 21 moves in the vertical direction (the Z-direction) within such a range of altitude that it can get access to all the processing units of the third processing unit group $G_3$ and also moves in the X-direction and the θ-direction to thereby transfer the wafer W between the processing units.

As a concrete example of auxiliary transfer, auxiliary transfer in which in the third processing unit group $G_3$, the wafer W, for example, which has undergone hydrophobic processing (HMDS processing) is taken out of the adhesion unit (AD), moved downward, and delivered to the cooling unit (COL) by the wafer holding member 21a of the secondary wafer transfer machine 21 can be performed. As another example, auxiliary transfer can be performed. The auxiliary transfer takes the wafer W that has undergone pre-bake processing out of the hot plate unit (HP) by means of the wafer holding member 21a after the completion of coating processing, and moves downward the wafer holding member 21a to deliver the wafer W to the cooling unit (CL). Further, the temperatures of the hot plate units (HP) are set at various temperatures, and the wafer W is sometimes transferred, for example, from the hot plate unit (HP) set at a lower temperature to the hot plate unit (HP) set at a higher temperature. In this case, auxiliary transfer can be performed by the use of the wafer holding member 21a of the secondary wafer transfer machine 21.

As described above, the wafer holding member 21a of the secondary wafer transfer machine 21 can be also structured to transfer the wafer W to the processing units of the first processing unit group $G_1$. In this case, auxiliary transfer can be performed between the processing units of the third processing unit group $G_3$ and the processing units of the first processing unit group $G_1$. As an concrete example thereof, there can be performed auxiliary transfer in which the wafer W is taken out of the resist coating unit (COT) of the first processing unit group $G_1$ by the wafer holding member 21a, and which the holding member 21a is moved in the horizontal direction (the X-direction), moved in the vertical direction (the Z-direction), and rotated in the θ-direction to deliver the wafer W to a predetermined hot plate unit (HP) of the third processing unit group $G_3$ so that the wafer W undergoes pre-bake processing. As another example, there can be performed auxiliary transfer in which the wafer W is taken out of the developing unit (DEV) of the first processing unit group $G_1$ by the wafer holding member 21a, and which the wafer holding member 21a is moved in the horizontal direction (the X-direction), moved in the vertical direction (the Z-direction), and rotated in the θ-direction to deliver the wafer W to a predetermined hot plate unit (HP) of the third processing unit group $G_3$ so that the wafer W undergoes post-bake processing.

Incidentally, the processing units of the third processing unit group $G_3$ in the processing station 11 each have a carrying in/out port also in a face on the cassette station 10 side so that the wafer holding member 21a of the secondary wafer transfer machine 21 can get access thereto. In the case where the wafer holding member 21a gets access also to the processing units of the first processing unit group $G_1$, a carrying in/out port is formed also in a face on the cassette station 10 side of each of the processing units of the first processing unit group $G_1$. Moreover, the wafer holding member 21a may be structured to be accessible to part of the processing units instead of all the processing units of the third processing unit group $G_3$.

In the case of ordinary transfer, the secondary wafer transfer machine 24 in the interface section 12 delivers the wafer W from/to the cassettes CR and BR, the peripheral aligner 23 or the processing unit (EXT). Further, the secondary wafer transfer machine 24 moves the wafer holding member 24a in the horizontal direction (the X-direction), moves it in the vertical direction (Z-direction) within a predetermined range of altitude, rotates it in the θ-direction, receives the wafer W which has undergone coating processing from the extension unit (EXT) of the fourth processing unit group $G_4$, and get access to both the cassette CR and BR, the peripheral aligner 23, and the aligner (not illustrated). Moreover, the secondary wafer transfer machine 24 moves the wafer holding member 24a in the horizontal direction (the X-direction), moves it in the vertical direction (the Z-direction) within a predetermined range of altitude, rotates it in the θ-direction, receives the exposed wafer W from the aligner (not illustrated), and sends it to the extension unit (EXT) of the fourth processing unit group $G_4$.

Figure 6:
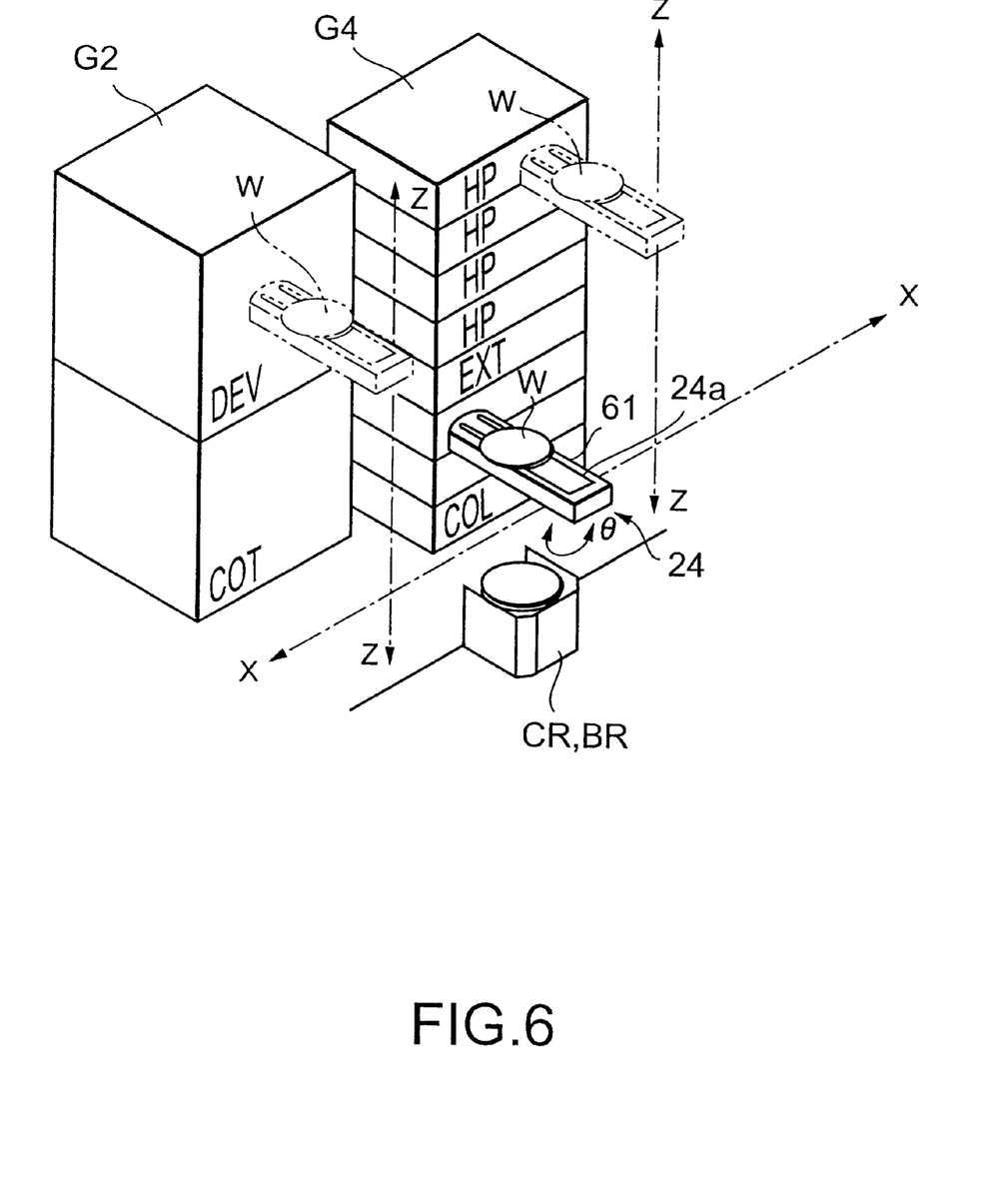
FIG. 6 is a schematic perspective view for explaining the transfer operation of a secondary wafer transfer machine provided in an interface section.

The secondary wafer transfer machine 24 can perform auxiliary transfer when not performing the ordinary transfer. In the case of auxiliary transfer, as shown in FIG. 6, the wafer holding member 24a of the secondary transfer machine 24 moves in the vertical direction (the Z-direction) within such a range of altitude that it can get access to all the processing units of the fourth processing unit group $G_4$ and also moves in the X-direction and the θ-direction to thereby transfer the wafer W between the processing units.

As a concrete example of auxiliary transfer, there can be performed auxiliary transfer in which in the fourth processing unit group $G_4$, the wafer W which has undergone pre-bake processing, for example, is taken out of the hot plate unit (HP), moved downward, and delivered to the cooling unit (COL) by the wafer holding member 24a of the secondary wafer transfer machine 24. Moreover, when the wafer W is transferred between the hot plate units (HP) with different temperatures, auxiliary transfer can be performed by using the wafer holding member 24a of the secondary wafer transfer machine 24.

As described above, the wafer holding member 24a of the secondary wafer transfer machine 24 can be also structured to transfer the wafer W to the processing units of the second processing unit group $G_2$, in which case auxiliary transfer can be performed between the processing units of the fourth processing unit group $G_4$ and the processing units of the second processing unit group $G_2$. As an concrete example thereof, there can be performed auxiliary transfer in which the wafer W is taken out of the resist coating unit (COT) of the second processing unit group $G_2$ by the wafer holding member 24a, and which the holding member 24a is moved in the horizontal direction (the X-direction), moved in the vertical direction (the Z-direction), and rotated in the θ-direction to deliver the wafer W to a predetermined hot plate unit (HP) of the fourth processing unit group $G_4$ so that the wafer W undergoes pre-bake processing. As another example, there can be performed auxiliary transfer in which the wafer W is taken out of the developing unit (DEV) of the second processing unit group $G_2$ by the wafer holding member 24a, and which the wafer holding member 24a is moved in the horizontal direction (the X-direction), moved in the vertical direction (the Z-direction), and rotated in the θ-direction to deliver the wafer W to a predetermined hot plate unit (HP) of the fourth processing unit group $G_4$ so that the wafer W undergoes post-bake processing.

Incidentally, the processing units of the fourth processing unit group $G_4$ in the processing station 11 each have a carrying in/out port also in a face on the interface section 12 side so that the wafer holding member 24a of the secondary wafer transfer machine 24 can get access thereto. In the case where the wafer holding member 24a gets access also to the processing units of the second processing unit group $G_2$, a carrying in/out port is formed also in a face on the interface station 11 side of each of the processing units of the second processing unit group $G_2$. Moreover, the wafer holding member 24a may be structured to be accessible to part of the processing units instead of all the processing units of the fourth processing unit group $G_4$.

As described above, the auxiliary transfer in which the wafer W can be carried in and out between a plurality of various kinds of processing units by the secondary wafer transfer machine 21 which carries the wafer W in and out in the cassette station 10 in ordinary transfer and the secondary wafer transfer machine 24 which carries the wafer W in and out in the interface section 12 in ordinary transfer, and hence the secondary wafer transfer machines 21 and 24 perform part of transfer work performed by the main wafer transfer machine 46 in the processing station 11 in ordinary transfer in place of the main wafer transfer machine 46. Consequently, they can assist the main wafer transfer machine 46 in a part of the transfer process of the main wafer transfer machine 46, leading not only to improvement in the transfer capacity of the entire system, but also to improvement in processing speed for the wafer W.

Figure 7:
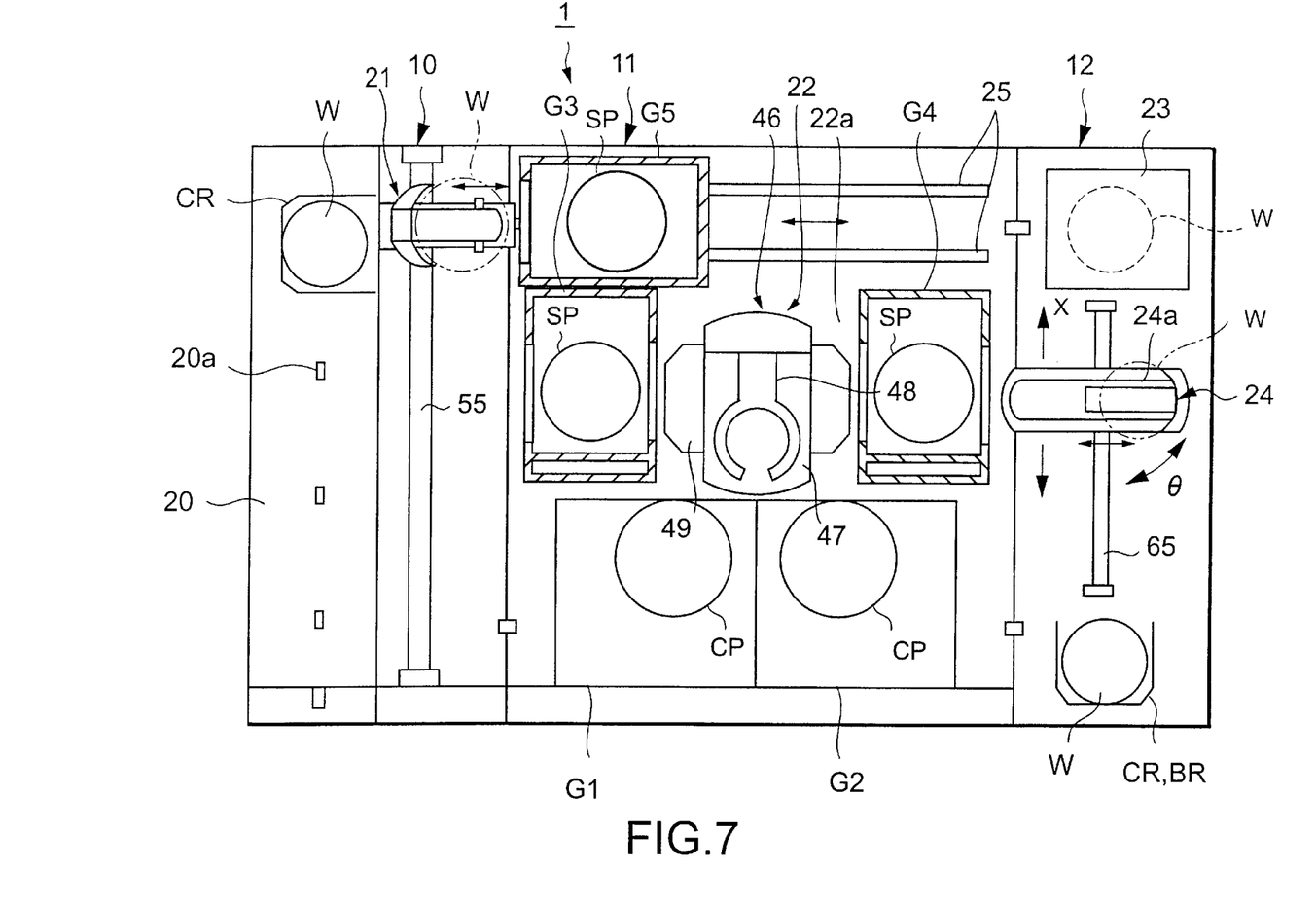
FIG. 7 is a plan view showing a resist coating and developing processing system according to another embodiment of the present invention.

When the fifth processing unit group $G_5$ is disposed, as shown in FIG. 7, it is suitable that the fifth processing unit group $G_5$ can be moved to the cassette station 10 side along the guide rails 25, and that the secondary wafer transfer machine 21 gets access to each of the processing units of the fifth processing unit group $G_5$ when the fifth processing unit group $G_5$ shifts to the cassette station side.

It should be mentioned that the present invention is not limited to the above embodiment but can be modified variously.

Figure 9:
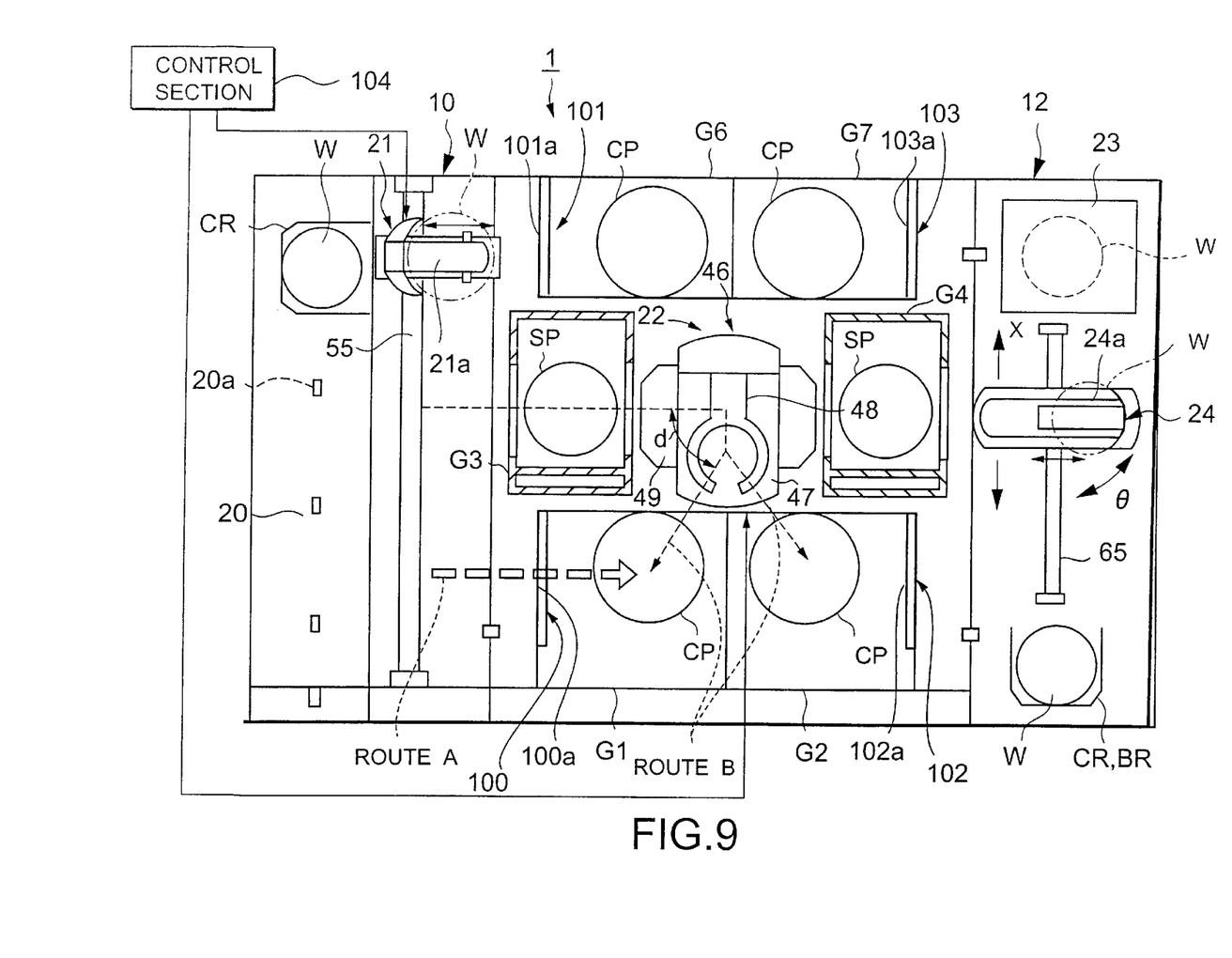
FIG. 9 is a plan view showing a modified example according to still another embodiment of the present invention.

Although the case where the fifth processing unit group $G_5$ is disposed is explained in the embodiment, for example, a sixth processing unit group $G_6$ and a seventh processing unit group $G_7$ having the same structure as the first processing unit group $G_1$ and the second processing unit group $G_2$ may be disposed on the rear side of the main wafer transfer mechanism 22 instead of providing the fifth processing unit group $G_5$ as shown in FIG. 9.

In such a modified example, the processing unit groups $G_6$ and $G_7$, and the processing unit groups $G_1$ and $G_2$ are arranged symmetrically with respect to the main wafer transfer machine 46, namely, the processing unit groups $G_1$, $G_2$, $G_6$, and $G_7$ are arranged around the main wafer transfer machine 46, resulting in improvement in processing speed, which is specially effective when the kinds of developing solutions and resists are numerous.

In this case, respective processing units included in the first processing unit group $G_1$ and the sixth processing unit group $G_6$ may be provided with carrying ports 100 and 101 in faces on the cassette station 10 side respectively. Thereby, the secondary holding member 21a can get access directly to each of the solution-system processing units. Similarly, respective processing units included in the second processing unit group $G_2$ and the seventh processing unit group $G_7$ may be provided with carrying ports 102 and 103 facing the interface section 12 side respectively. Thereby, the holding member 24a of the secondary wafer transfer machine 24 can get access directly to each of the solution-system processing units. In the above case, it is preferable that the carrying ports 100 to 103 are provided with shutter members 100a to 103a respectively, thereby preventing waste resist solution or waste developing solution by rotational centrifugal force of the spinner-type processing unit from scattering to the outside.

Also, in this modified example, as is the case with the above embodiment, a positioning correcting mechanism for the wafer W not illustrated is provided. Between a case where the wafer W is directly carried into the resist coating unit (COT) of the first processing unit group $G_1$ from the secondary wafer transfer machine 21 as shown in the arrow A (hereinafter referred to as "a route A") and a case where the wafer W is temporarily carried into the extension unit (EXT) of the third processing unit group $G_3$ and thereafter placed in the resist coating unit (COT) via the main wafer transfer machine 46 as shown by the arrow B (hereinafter referred to as "a route B"), there arises a phase difference in mounting position if both the cases are compared in states in which the wafer W is mounted. When the route A is the basis of this phase, the angle of the wafer W placed in the cup (CP)

via the route B is displaced by an oscillating angle α of the wafer holding member 48, and hence the wafer W is aligned on the basis of the route A by the positioning correcting mechanism not illustrated, thereby correcting the angle α to zero.

Next, the preferential selection and operation control of the wafer transfer machine will be explained with reference to FIG. 1 and FIG. 2. Giving an outline thereof, the wafer W held by the wafer holding member 21a of the secondary wafer transfer machine 21 on the cassette station 10 side is carried in by either the route A or the route B. On this occasion, a control section 104 detects which of the secondary wafer transfer machine 21 and the main wafer transfer machine 46 is in an idle state and operable, and preferentially selects a wafer transfer machine which is determined to be in the idle state and operates it.

Figure 10:
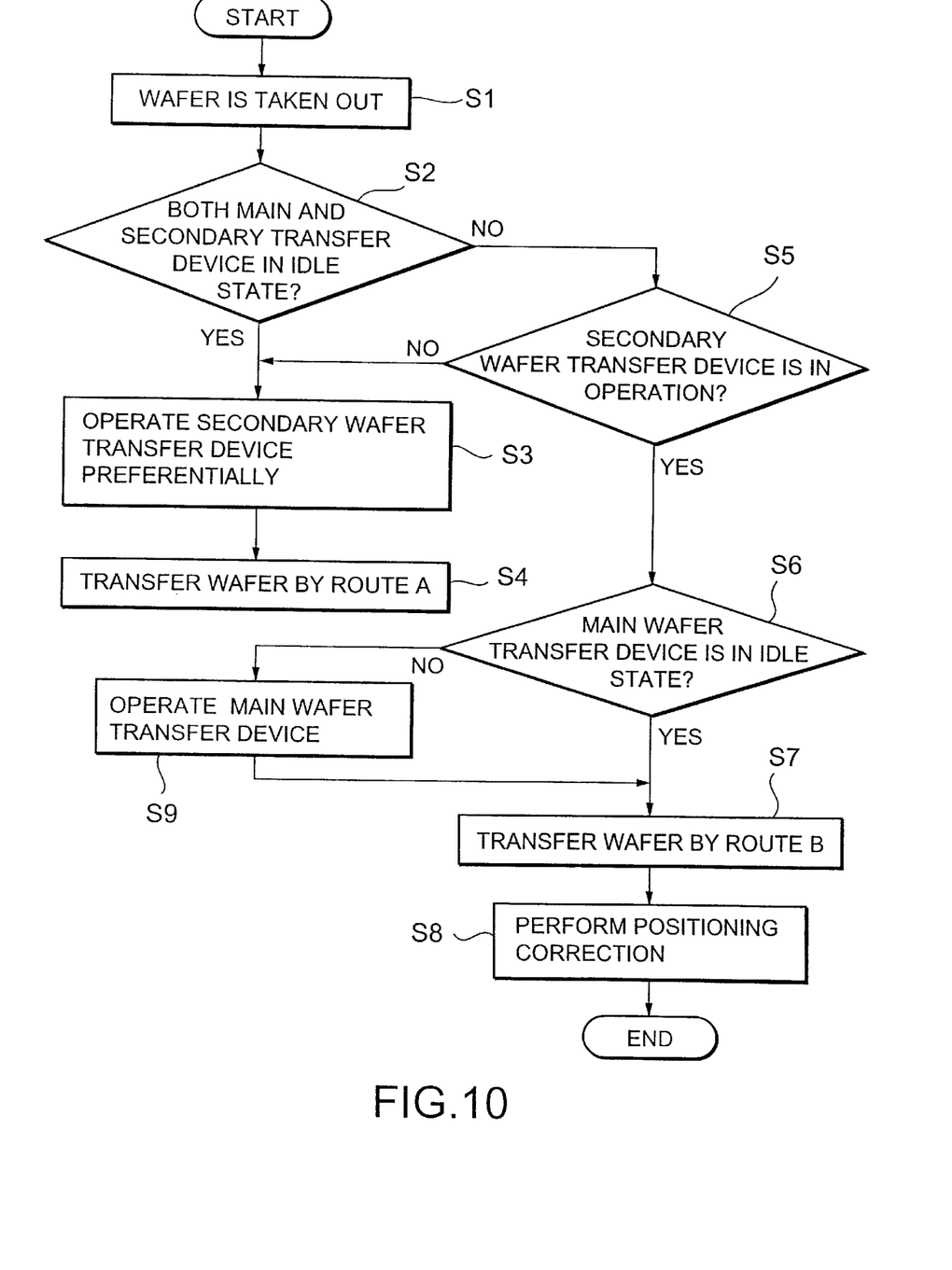
FIG. 10 is a flowchart showing a control system according to the modified example in FIG. 9.

As for the preferential selection and operation control by the control section 104, as shown in FIG. 10, it is first recognized that the wafer holding member 21a of the secondary wafer transfer machine 21 has taken one wafer W out of the wafer cassette CR (step 1). In step 2, it is determined which of the secondary wafer transfer machine 21 and the main wafer transfer machine 46 is suitable for carrying the wafer W into the resist coating unit (COT) of the first processing unit group $G_1$. When it is determined that both of the wafer transfer machines are in the idle state, the secondary wafer transfer machine 21 is preferentially selected, and the wafer W is transferred to the resist coating unit (COT) by the route A (step 4). During this transfer, the main wafer transfer machine 46 can afford to perform another transfer.

Meanwhile, when the judgment of NO is given in step 2, that is, when either of the secondary wafer transfer machine 21 or the main wafer transfer machine 46 or both of the wafer transfer machines 21 and 46 are in the idle state, the procedure advances to step 5, and it is preferentially determined whether the secondary wafer transfer machine 21 is in the idle state or not. When the secondary wafer transfer machine 21 is not in the idle state, that is, when it is in operation, the procedure advances to step 6. When it is determined in step 5 that the secondary wafer transfer machine 21 is in the idle state, the procedure advances to step 3 and the wafer W is transferred by the route A (step 4).

When the secondary wafer transfer machine 21 is in operation, it is determined in step 6 whether the main wafer transfer machine 46 is in the idle state or not. When it is determined that the main wafer transfer machine 46 is in the idle state, the wafer W is transferred by the route B (step 7). Specifically, the main wafer transfer machine 46 is selected, and the wafer W temporarily carried into the extension unit (EXT) of the third processing unit group $G_3$ by the holding member 21a is passed to the wafer holding member 48 of the main wafer transfer machine 46 and carried into the resist coating unit (COT) of the first or the second processing unit group $G_1$ or $G_2$.

At this time, the positioning correcting mechanism for the wafer W is operated to perform predetermined positioning correction for the wafer W (step 8), and the transfer is completed.

On the other hand, when it is determined in step 6 that the main wafer transfer machine 46 is not in the idle state, that is, it is in operation, the main wafer transfer machine 46 is selected and an operation signal is outputted thereto (step 9). Subsequently, the procedure advances to step 7, and the wafer W is transferred by the route B. In step 8, correction by the positioning correcting mechanism for the wafer W is performed, and the transfer is completed.

Incidentally, although the above explanation is given with the control between the secondary wafer transfer machine 21 and the main wafer transfer machine 46 as the example, control is the same also with respect to the delivery of the wafer W by the secondary wafer transfer machine 24 on the interface section 12 side and the main wafer transfer machine 46.

The case where the transfer machine in the cassette station and the transfer machine in the interface section each have a function of auxiliary transfer between the processing units is explained, but either of them may have the auxiliary transfer function.

Figure 8:
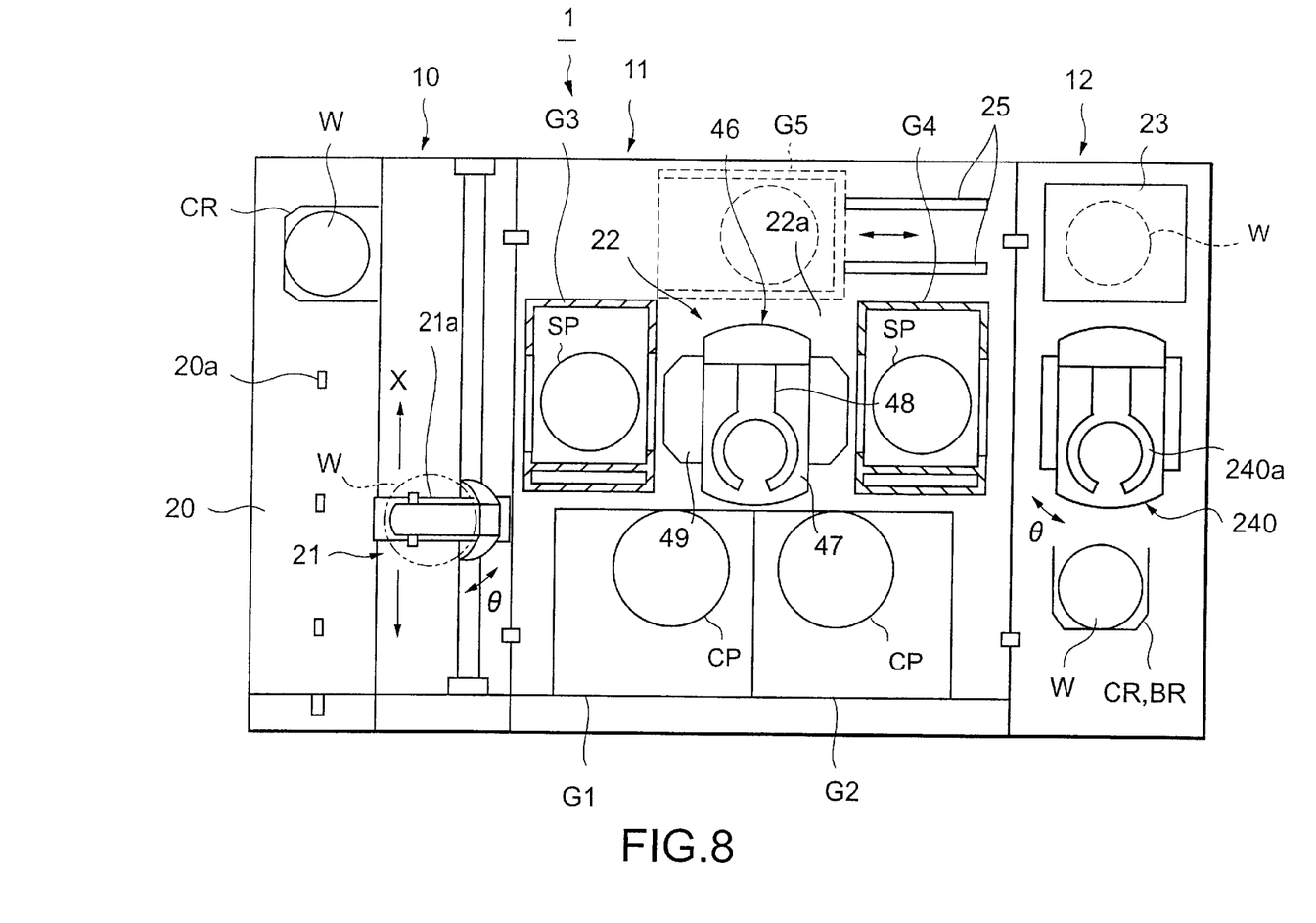
FIG. 8 is a plan view showing a modified example according to another embodiment of the present invention.

Further, the secondary transfer machine 24 in the interface section in the above embodiment is structured to be able to travel on the rail in the X-direction, but as shown in FIG. 8, it is possible to use a wafer transfer machine 240 having the same structure as the main wafer transfer machine 46, remove the rail 65, and place the wafer transfer machine 240 at a fixed position, instead.

According to such a structure, the wafer holding member 240a ascends and descends in the Z-direction and rotates in the θ-direction, whereby the ordinary transfer and auxiliary transfer of the wafer W can be performed likewise with the above embodiment.

Furthermore, the resist coating and developing processing system is explained in the above embodiment, but not limited to this, the present invention can be also applied to other processing systems. Moreover, the semiconductor wafer is used as a substrate in the present invention, but not limited to this, the present invention can be also applied to processing for other substrates such as a substrate for a liquid crystal display (LCD) and the like.

As explained above, according to the present invention, instead of transferring a substrate between a plurality of processing units by only a main transfer machine in a processing section, while a secondary transfer machine which ordinarily carries the substrate in and out in a substrate carrying in/out section stands by, the secondary transfer machine vertically moves to thereby be able to transfer the substrate between the plurality of processing units in the processing section. As a result, the secondary transfer machine can assist the main wafer transfer machine in a part of the transfer process of the main transfer machine, leading to not only improvement in transfer capacity as a whole, but also improvement in substrate processing speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing apparatus configured to subject a substrate to a given processing, comprising:
   a substrate carrying section configured to load and unload the substrate;
   a processing section including a plurality of processing units vertically stacked and configured to subject the substrate to various kinds of processing;
   a main transfer machine configured to freely move in a vertical direction in said processing section, and to transfer the substrate from one of said processing units to another of said processing units; and
   a secondary transfer machine configured to freely move in a vertical direction in said substrate carrying section, to deliver the substrate between said substrate carrying section and said processing section and to transfer the substrate from one processing unit to another processing unit in said processing section when said carrying section does not deliver the substrate.

2. The apparatus as set forth in claim 1,
wherein said processing section has at least two processing unit groups each having a plurality of processing units vertically stacked, and
wherein said main transfer machine is arranged to be surrounded by said processing unit groups.

3. The apparatus as set forth in claim 2,
wherein said secondary transfer machine is configured to receive the substrate from one of said processing units of one of said processing unit groups, move vertically, and deliver the substrate to another one of said processing units of said one of said processing unit groups.

4. The apparatus as set forth in claim 2,
wherein said secondary transfer machine is configured to receive the substrate from any one of said processing units of one of said processing unit groups, move horizontally or vertically, and deliver the substrate to any one of said processing units of another one of said processing unit groups.

5. A substrate processing apparatus configured to coat a substrate with a resist and to subject the substrate to developing processing after the resist is exposed in accordance with a predetermined pattern, said apparatus comprising:
a substrate carrying section configured to the substrate;
a processing section having a plurality of processing units vertically stacked and configured to subject the substrate to resist coating and developing processing and thermal processing before and after the resist coating and developing processing;
a main transfer machine disposed to freely move in a vertical direction in said processing section, and configured to transfer the substrate from one of said processing units to another of said processing units; and
a secondary transfer machine disposed to freely move in a vertical direction in said substrate carrying in/out section, configured to deliver the substrate between said substrate carrying section and said processing section and to transfer the substrate from one of said processing units to another of said processing units in said processing section when said carrying section does not deliver the substrate.

6. The apparatus as set forth in claim 5, further comprising:
an interface section configured to transfer the substrate between said processing section and an aligner; and
an additional secondary transfer machine configured to freely move in a vertical direction in said interface section, for performing a delivery operation of delivering the substrate between said interface section and said processing section and transferring the substrate from one of said processing units to another of said processing units in said processing section while waiting for said delivery operation.

7. The apparatus as set forth in claim 5,
wherein said substrate carrying section is configured to receive a plurality of substrates in a cassette, and said secondary transfer machine transfers the substrates from the cassette to said processing section, and takes in a processed substrate from said processing section and houses it in said cassette.

8. The apparatus as set forth in claim 5,
wherein said processing section has at least two processing unit groups each having a plurality of processing units vertically stacked, and
said main transfer machine is arranged to be surrounded by said processing unit groups.

9. The apparatus as set forth in claim 8,
wherein one of said processing unit groups has a plurality of thermal system processing units each subjecting the substrate to thermal processing, and
another of said processing unit groups has a plurality of rotary system processing units each subjecting the substrate to coating processing of coating the substrate with the resist or a developing solution while rotating the substrate.

10. The apparatus as set forth in claim 9, which said rotary system processing units include carrying ports disposed on portions facing said substrate carrying section and said interface section, respectively and configured to access said secondary transfer machine.

11. The apparatus as set forth in claim 10, further comprising a shutter member configured to open and close said carrying ports.

12. The apparatus as set forth in claim 6, wherein said processing section has at least two processing unit groups each having a plurality of processing units vertically stacked,
one of said processing unit groups has a plurality of thermal system processing units each subjecting the substrate to thermal processing,
another of said processing unit groups has a plurality of rotary system processing units each coating the substrate with the resist or a developing solution while rotating the substrate, and
said secondary transfer machine or said additional secondary transfer machine is configured to receive the substrate from one of said thermal system processing units of said one of said processing unit groups and deliver the substrate to another of said thermal system processing units of said one of said processing unit groups.

13. The apparatus as set forth in claim 6, wherein
said processing section has at least two processing unit groups each having a plurality of processing units vertically stacked,
one of said processing unit groups has a plurality of thermal system processing units each subjecting the substrate to thermal processing,
another of said processing unit groups has a plurality of rotary system processing units each coating the substrate with the resist or a developing solution while rotating the substrate, and
said secondary transfer machine or said additional secondary transfer machine is configured to transfer the substrate between said one of said processing unit groups having said thermal system processing units and said another of said processing unit groups having said rotary system processing units.

14. The apparatus as set forth in claim 2, wherein any one of said processing unit groups is configured to move to a position to which said secondary transfer machine accesses.

15. The apparatus as set forth in claim 6, wherein said additional secondary transfer machine is disposed at a fixed position in said interface section.

16. The apparatus as set forth in claim 9, wherein said another of said processing unit groups and said one of said processing unit groups are disposed at positions nearly symmetrical with respect to said main transfer machine on front and rear sides of said processing section.

17. The apparatus as set forth in claim 10, further comprising a control section configured to operate said main transfer machine and said secondary transfer machine based on a command signal, and wherein said control section determines whether or not either of said main transfer machine or said secondary transfer machine is in an idle state in which the delivery of the substrate is not performed when the substrate is transferred after either of a route in which the substrate is directly carried into said rotary system processing unit from said secondary transfer machine or a route in which the substrate is carried by said main transfer machine is selected, and when determining that both of said main and secondary transfer machines are in the idle state, said control means performs such control that said secondary transfer machine is preferentially selected and that the substrate is carried into the rotary system processing unit from said substrate carrying section.

18. The apparatus as set forth claim 17, wherein said control section performs such control that the transfer machine in the idle state is preferentially selected and that the substrate is carried into said rotary system processing unit when determining that either of said main transfer machine or said secondary transfer machine is in the idle state.

19. The apparatus as set forth in claim 17, further comprising a correcting section configured to correct an angle of the substrate carried into said rotary system processing unit when a route in which the substrate is transferred by said main transfer machine is selected by said control section.

20. A substrate processing apparatus configured to coat a substrate with a resist and to subject the substrate to developing processing after the resist is exposed in accordance with a predetermined pattern, said apparatus comprising:

a substrate carrying section configured to load and unload the substrate;

a processing section including a plurality of processing units vertically stacked and configured to subject the substrate to resist coating and developing processing and thermal processing before and after the resist coating and developing processing;

a main transfer machine configured to freely move in a vertical direction in said processing section, and to transfer the substrate from one of said processing units to another of said processing units;

an interface section configured to deliver the substrate between said processing section and an aligner; and a secondary transfer machine configured to freely move in a vertical direction in said interface section, to deliver the substrate between said interface section and said processing section and to transfer the substrate from one of said processing units to another of said processing units in said processing section when said carrying section does not deliver said substrate.

* * * * *